United States Patent
Murata et al.

(10) Patent No.: US 10,491,144 B2
(45) Date of Patent: Nov. 26, 2019

(54) MAGNETIC POLE POSITION DETECTION DEVICE AND MOTOR CONTROL DEVICE

(71) Applicant: Mitsubishi Electric Corporation, Tokyo (JP)

(72) Inventors: Munehiro Murata, Tokyo (JP); Akira Tanabe, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/311,089

(22) PCT Filed: Mar. 21, 2017

(86) PCT No.: PCT/JP2017/011120
§ 371 (c)(1),
(2) Date: Dec. 18, 2018

(87) PCT Pub. No.: WO2018/173102
PCT Pub. Date: Sep. 27, 2018

(65) Prior Publication Data
US 2019/0181782 A1    Jun. 13, 2019

(51) Int. Cl.
*H02P 6/18*        (2016.01)
*H02P 21/18*       (2016.01)
(Continued)

(52) U.S. Cl.
CPC ............... *H02P 6/18* (2013.01); *G01R 33/02* (2013.01); *H02P 21/18* (2016.02); *H02P 21/32* (2016.02)

(58) Field of Classification Search
USPC ......................................... 318/565, 603–605
See application file for complete search history.

(56) References Cited

U.S. PATENT DOCUMENTS 5,051,680 A * 9/1991 Belanger ................. H02P 1/163
                                                318/400.22
5,691,625 A * 11/1997 Kumar ................ F02N 11/0859
                                                318/701
(Continued)

FOREIGN PATENT DOCUMENTS

EP    2 437 391 A1    4/2012
JP    2000-92891 A    3/2000
(Continued)

OTHER PUBLICATIONS

English-language translation of International Search Report and Written Opinion for International Application No. PCT/JP2017/011120, dated May 30, 2017.

*Primary Examiner* — Bentsu Ro
(74) *Attorney, Agent, or Firm* — Xsensus LLP (57) ABSTRACT

A magnetic pole position detection device of a motor control device includes a calculation unit to estimate a magnetic pole position. The calculation unit generates a voltage pulse command for three-phase connection to actuate all of three legs included in an inverter, and a voltage pulse command for one phase opened to actuate only two of the three legs, and narrows down the estimation range on the basis of a first magnetic pole position estimated value estimated on the basis of a motor current that flows during application of the voltage pulse command for three-phase connection, and a second magnetic pole position estimated value estimated on the basis of a motor current that flows during application of the voltage pulse command for one phase opened.

8 Claims, 11 Drawing Sheets

(51) Int. Cl.
*H02P 21/32* (2016.01)
*G01R 33/02* (2006.01)

(56) References Cited

U.S. PATENT DOCUMENTS

| | | | | |
|---|---|---|---|---|
| 5,854,548 A * | 12/1998 | Taga | ............... | H02P 6/185 |
| | | | | 318/721 |
| 5,859,518 A * | 1/1999 | Vitunic | ............... | H02P 6/185 |
| | | | | 318/400.12 |
| 6,583,593 B2 * | 6/2003 | Iijima | ............... | H02P 6/18 |
| | | | | 318/400.02 |
| 6,696,812 B2 * | 2/2004 | Kaneko | ............... | B60L 15/025 |
| | | | | 318/700 |
| 7,577,545 B2 * | 8/2009 | Hu | ............... | H02P 21/06 |
| | | | | 702/147 |
| 7,965,053 B2 * | 6/2011 | Borisavljevic | ............... | G01P 3/48 |
| | | | | 318/400.31 |
| 2016/0233803 A1 | 8/2016 | Hano | | |

FOREIGN PATENT DOCUMENTS

| | | |
|---|---|---|
| JP | 2003-180094 A | 6/2003 |
| WO | 2010/137133 A1 | 12/2010 |
| WO | 2015/041321 A1 | 3/2015 |

* cited by examiner

| UPPER ARM SWITCH | LOWER ARM SWITCH | SWITCHING PATTERN |
|---|---|---|
| ON | OFF | 1 |
| OFF | ON | 0 |
| OFF | OFF | X |
| ON | ON | |

| Max Amplitude of Δi | Magnetic Pole Position[°] |
|---|---|
| Δiu1 | 0 |
| -Δiw1 | 60 |
| Δiv1 | 120 |
| -Δiu1 | 180 |
| Δiw1 | 240 |
| -Δiv1 | 300 |

| Max Amplitude of Δi | Magnetic Pole Position[°] |
| --- | --- |
| -Δiw2 | 30 |
| Δiv2 | 90 |
| -Δiu2 | 150 |
| Δiw2 | 210 |
| -Δiv2 | 270 |
| Δiu2 | 330 |

FIG.12

| Max Amplitude of $\Delta i$ | Magnetic Pole Position[°] |
|---|---|
| $\Delta iu1$ and $-\Delta iw2$ | 15 |
| $-\Delta iw2$ and $-\Delta iw1$ | 45 |
| $-\Delta iw1$ and $\Delta iv2$ | 75 |
| $\Delta iv2$ and $\Delta iv1$ | 105 |
| $\Delta iv1$ and $-\Delta iu2$ | 135 |
| $-\Delta iu2$ and $-\Delta iu1$ | 165 |
| $-\Delta iu1$ and $\Delta iw2$ | 195 |
| $\Delta iw2$ and $\Delta iw1$ | 225 |
| $\Delta iw1$ and $-\Delta iv2$ | 255 |
| $-\Delta iv2$ and $-\Delta iv1$ | 285 |
| $-\Delta iv1$ and $\Delta iu2$ | 315 |
| $\Delta iu2$ and $\Delta iu1$ | 345 |

MAGNETIC POLE POSITION DETECTION DEVICE AND MOTOR CONTROL DEVICE

CROSS-REFERENCE TO RELATED APPLICATION

This application is a National Stage Application based on PCT/JP2017/011120, filed on 21 Mar. 2017, the entire contents of which being incorporated herein by reference.

FIELD

The present invention relates to a magnetic pole position detection device capable of detecting a magnetic pole position of a motor that drives industrial machinery such as a machine tool, and to a motor control device including the magnetic pole position detection device.

BACKGROUND

One example of a motor that drives industrial machinery is a synchronous magnet motor. A synchronous magnet motor generally requires a current control operation in accordance with the magnetic pole position of the rotor. An attempt to rotate the motor during unstable magnetic pole position of the motor reduces the output torque per unit current of the motor, and thus a desired output characteristic may not be achieved. The magnetic pole position of a motor can be calculated from positional data of a detector if the attachment position relationships between the detector and the motor magnetic poles are known. However, the attachment position relationships between the detector and the motor magnetic poles may vary from motor to motor. In this case, the magnetic pole position cannot be detected accurately from positional data, thereby requiring estimation of the magnetic pole position.

In addition, the motor that drives industrial machinery may be used for a horizontal shaft or a gravity shaft. In a case of use for a horizontal shaft, a method is proposed in which a current sufficient to actually drive the motor is supplied, and the rotational operation of the motor is then observed to estimate the magnetic pole position. Otherwise, in a case of use for a gravity shaft, to prevent dropping of the gravity shaft, the magnetic pole position of the motor needs to be estimated while the motor is mechanically restrained, that is, while the motor is in a stopped state. This presents a problem in that, when a motor is used for a gravity shaft, the magnetic pole position cannot be estimated from the motor operation.

To address the above problem, various motor control devices have been proposed that estimate the magnetic pole position while the motor is in a stopped state even if the motor is mechanically restrained.

One example of a motor control device that estimates the magnetic pole position while the motor is in a stopped state is described in Patent Literature 1 below. Patent Literature 1 discloses a technology in which measurement is made on the motor current when a voltage pulse output from the inverter is applied to the motor so as to estimate the magnetic pole position on the basis of the difference in the sum of the current amplitudes caused by the magnetic saturation characteristic of the winding. The technique of Patent Literature 1 causes a current to flow through the motor winding, but the current value is low, thereby avoiding generating a torque that rotates the motor. Thus, even if the target motor is connected to a fixed shaft mechanically restrained, the magnetic pole position can be estimated.

CITATION LIST

Patent Literature

Patent Literature 1: Japanese Patent Application Laid-open No. 2000-92891

SUMMARY

Technical Problem

However, the magnetic pole position estimated using the technique of Patent Literature 1 has a limitation in that the inverter can only output six patterns of voltage vectors. This presents a problem in that the estimated magnetic pole position may contain an error of ±30°, thereby preventing the output characteristics of the motor from being sufficiently exerted.

The present invention has been made in view of the foregoing, and it is an object of the present invention to provide a motor control device capable of estimating the magnetic pole position with a higher accuracy than a conventional technique does.

Solution to Problem

To solve the problem and achieve the object described above, a magnetic pole position detection device according to an aspect of the present invention is a magnetic pole position detection device that detects a magnetic pole position of a synchronous magnet motor. The detection device includes: a current detection unit to detect a motor current flowing to each phase of the synchronous magnet motor; and a calculation unit to generate a voltage pulse command to estimate the magnetic pole position; to output the voltage pulse command to an inverter that drives the synchronous magnet motor; and to estimate the magnetic pole position on a basis of the motor current that flows in response to the voltage pulse command during an operation of the inverter. The calculation unit generates a first voltage pulse command to actuate all of three legs included in the inverter, and a second voltage pulse command to actuate only two of the three legs, and narrows down an estimation range on a basis of a first magnetic pole position estimated value and a second magnetic pole position estimated value, the first magnetic pole position estimated value being estimated on a basis of the motor current that flows during application of the first voltage pulse command, the second magnetic pole position estimated value being estimated on a basis of the motor current that flows during application of the second voltage pulse command.

Advantageous Effects of Invention

The present invention provides an advantage in that it is possible to estimate the magnetic pole position with a higher accuracy than a conventional technique does.

DESCRIPTION OF EMBODIMENTS

A magnetic pole position detection device and a motor control device according to embodiments of the present invention will be described in detail below with reference to the drawings. Note that these embodiments are not intended to limit the scope of the present invention.

First Embodiment

Figure 1:
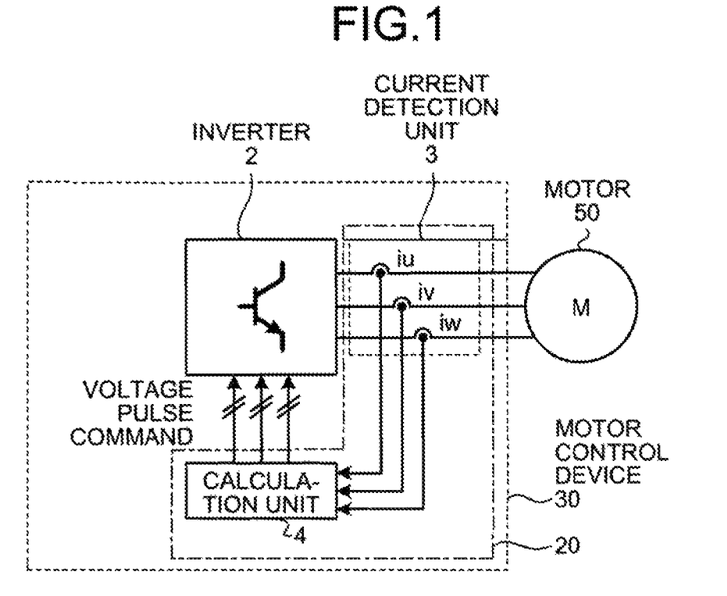
FIG. 1 is a block diagram illustrating a configuration of a motor control system according to a first embodiment.

FIG. 1 is a block diagram illustrating a configuration of a motor control system according to a first embodiment. As illustrated in FIG. 1, the motor control system according to the first embodiment includes a motor 50 and a motor control device 30 that controls the motor 50. The motor 50 is a synchronous magnet motor that includes a rotor (not illustrated) including permanent magnets and a stator (not illustrated) having three phases of motor windings including a U-phase winding, a V-phase winding, and a W-phase winding.

The motor control device 30 includes an inverter 2 and a magnetic pole position detection device 20 that detects the magnetic pole position of the motor 50. The magnetic pole position detection device 20 includes a current detection unit 3 and a calculation unit 4.

In the magnetic pole position detection device 20, the current detection unit 3 detects currents iu, iv, and iw each flowing to a phase of the motor 50. As used herein, a current flowing to each of the phases of the motor 50 is referred to as "motor current". The calculation unit 4 estimates the magnetic pole position of the motor 50 on the basis of the motor currents iu, iv, and iw detected by the current detection unit 3. The calculation unit 4 generates a voltage pulse for estimation of the magnetic pole position and outputs the voltage pulse to the inverter 2 during an estimation operation of the magnetic pole position of the motor 50. The inverter 2 operates according to the voltage pulse. The inverter 2 converts a direct current (DC) voltage from a voltage source not illustrated in FIG. 1 into a three-phase alternate current (AC) voltage, and applies the obtained AC voltage to each of the phases of the motor 50.

Figure 2:
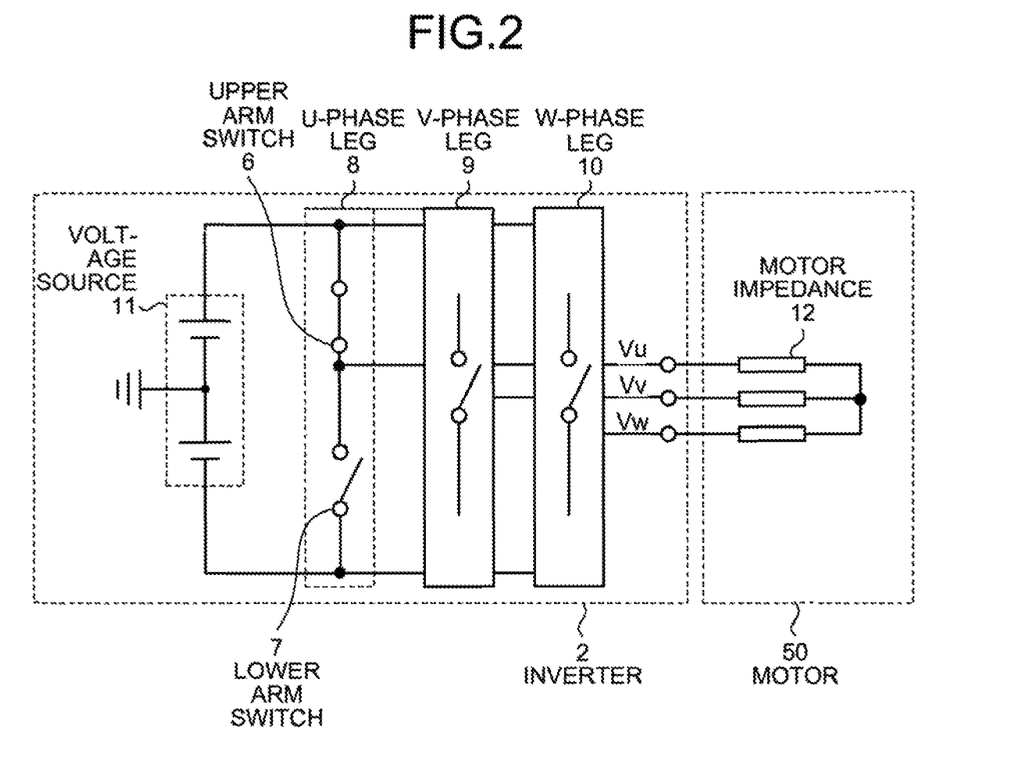
FIG. 2 is a block diagram illustrating an example configuration of the inverter.

FIG. 2 is a block diagram illustrating an example configuration of the inverter 2. FIG. 2 illustrates an example of a case in which the inverter 2 is configured as a three-phase voltage full-bridge inverter. The inverter 2 includes a voltage source 11 functioning as a source for supplying a DC voltage; a U-phase leg 8; a V-phase leg 9; and a W-phase leg 10. The U-phase leg 8, the V-phase leg 9, and the W-phase leg 10 constitute a power conversion main circuit. As illustrated in the U-phase leg 8, each of the phase legs is configured such that an arm including a pair of an upper arm switch 6 and a lower arm switch 7 connected in series with each other forms an arm corresponding to one phase. Although depicted simply in FIG. 2, each of the V-phase leg 9 and the W-phase leg 10 forms an arm corresponding to one phase similarly to the U-phase leg 8.

In the inverter 2, control is provided such that the upper arm switch 6 or the lower arm switch 7 is turned on or off in response to a voltage pulse command described later. This control causes the voltage from the voltage source 11 to be applied to the motor 50 through the upper arm switch 6 or the lower arm switch 7 so as to supply the motor currents iu, iv, and iw to the motor 50. Note that, as illustrated in FIG. 2, the motor 50 can be represented by an equivalent circuit including motor impedances 12 of the motor winding each inserted in a corresponding one of the phase. With this configuration, the motor currents iu, iv, and iw that flow in the motor 50 are determined in accordance with the voltage source 11, the ON period of the upper arm switch 6, the ON period of the lower arm switch 7, and the motor impedances 12.

Figure 3:
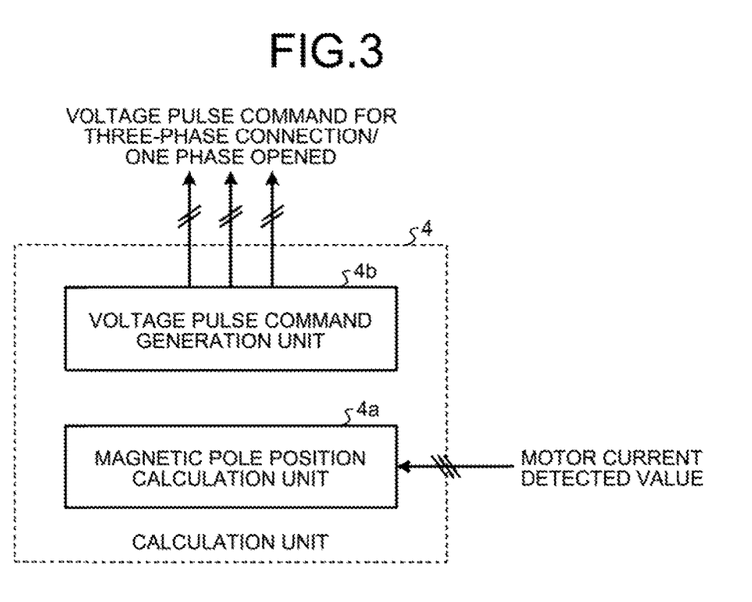
FIG. 3 is a block diagram illustrating a specific configuration of the calculation unit in the first embodiment.

FIG. 3 is a block diagram illustrating a specific configuration of the calculation unit 4 in the first embodiment. As illustrated in FIG. 3, the calculation unit 4 includes a magnetic pole position calculation unit 4a that performs an operation for estimating the magnetic pole position of the motor 50, and a voltage pulse command generation unit 4b that generates a voltage pulse for estimating the magnetic pole position. The voltage pulse command generation unit 4b generates two types of voltage pulse commands described later in detail, and applies these voltage pulse commands to the inverter 2. One of the two types of the voltage pulse commands is a first voltage pulse command, which is a voltage pulse command that actuates all the three legs, and the other of the two types of the voltage pulse commands is a second voltage pulse command, which is a voltage pulse command that actuates only two of the three legs. As used herein, the first voltage pulse command is referred to as "voltage pulse command for three-phase connection", and the second voltage pulse command is referred to as "voltage pulse command for one phase opened" because one leg is not actuated, that is, one phase is made an open phase.

Figure 4:
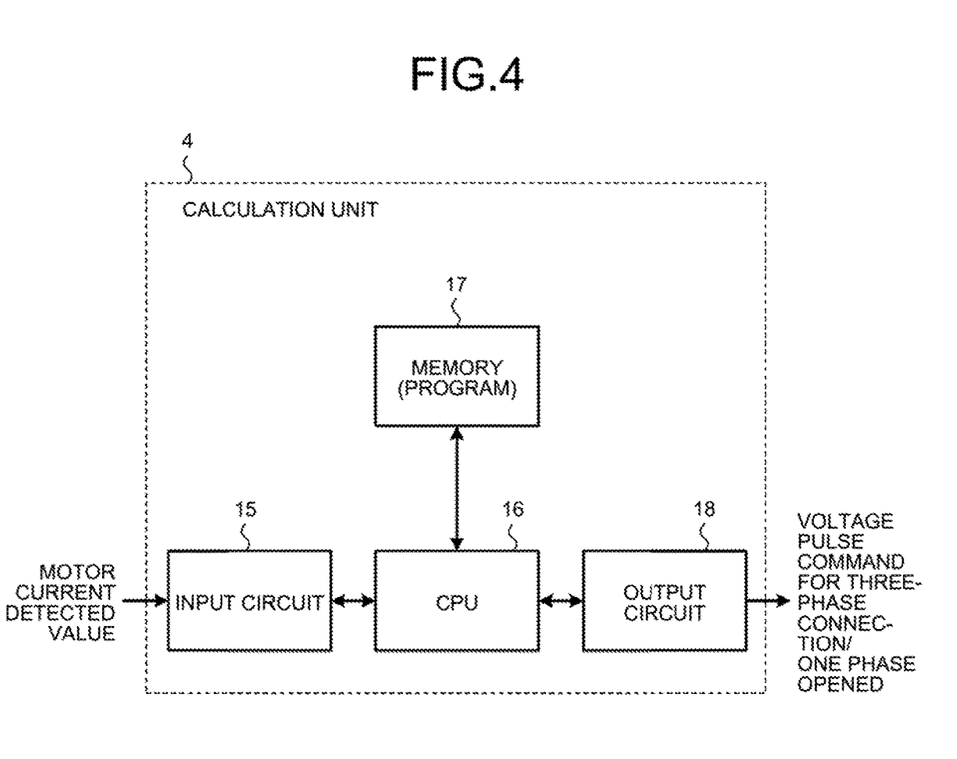
FIG. 4 is a block diagram illustrating an example of a hardware configuration for implementing the calculation unit in the first embodiment.

FIG. 4 is a block diagram illustrating an example of a hardware configuration for implementing the calculation unit 4 in the first embodiment. As illustrated in FIG. 4, when the function of the calculation unit 4 is implemented, the calculation unit 4 can be configured to include a central processing unit (CPU) 16 that performs computation, a memory 17 that stores a program read by the CPU 16, and an input circuit 15 and an output circuit 18 for inputting and outputting a signal. The CPU 16 may also be a calculation unit such as a microprocessor, a microcomputer, a processor, or a digital signal processor (DSP). The memory 17 may be a non-volatile or volatile semiconductor memory such as a random access memory (RAM), a read-only memory (RO), a flash memory, an erasable programmable ROM (EPROM), or an electrically erasable programmable ROM (EEPROM).

The memory 17 stores a program for implementing the function of the calculation unit 4 described later. The CPU 16 receives a detected value of a motor current via the input circuit 15, and performs computational processing for estimating the magnetic pole position on the basis of the detected value of a motor current. Information on the estimated magnetic pole position is stored in the memory 17. The CPU 16 selects one of the two types of voltage pulse commands described above, that is, "voltage pulse command for three-phase connection" and "voltage pulse command for one phase opened", and outputs the selected command to the inverter 2 via the output circuit 18.

Figure 5:
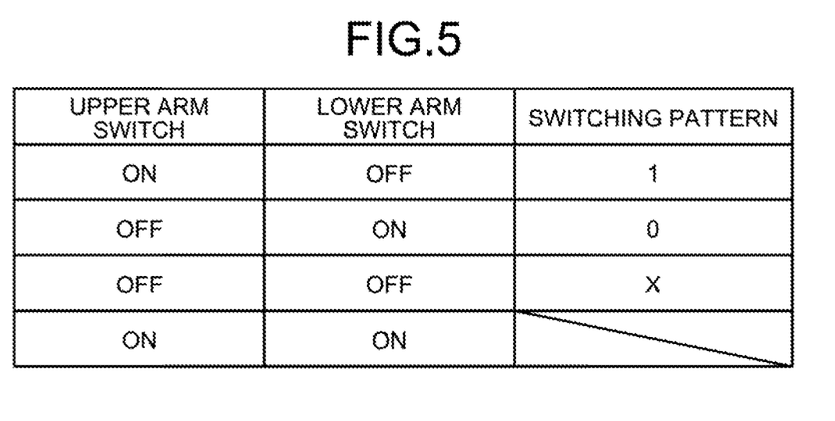
FIG. 5 is a chart illustrating switching states of the inverter used in the first embodiment.
Figure 6:
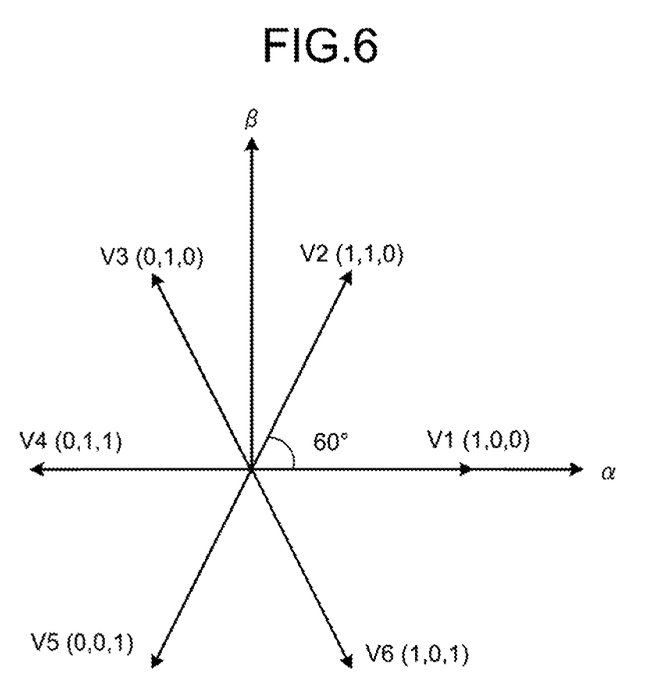
FIG. 6 is a vector diagram illustrating a set of first voltage pulse commands that the inverter of the first embodiment can output.
Figure 7:
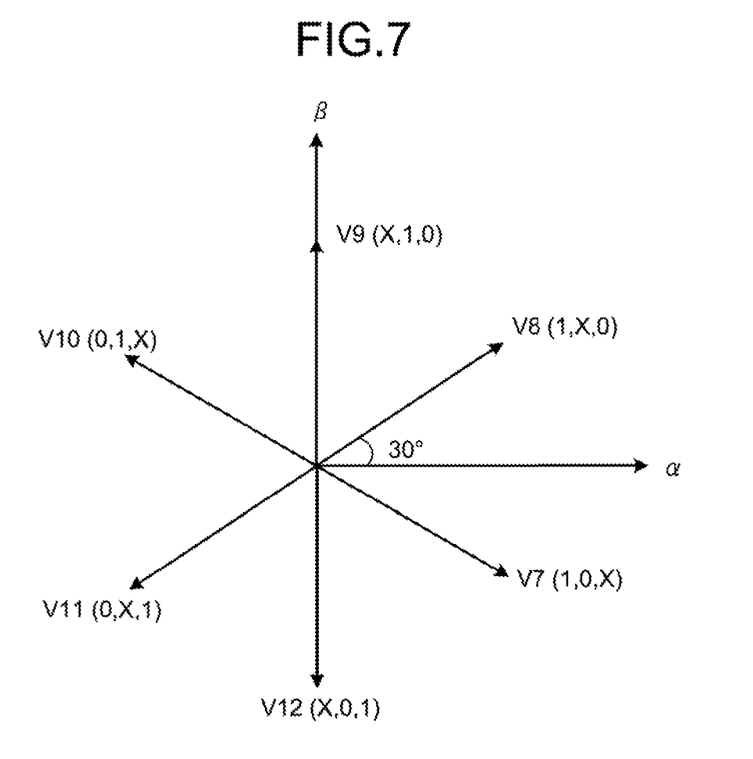
FIG. 7 is a vector diagram illustrating a set of second voltage pulse commands that the inverter of the first embodiment can output.

An operation of the inverter 2 in the first embodiment will next be described with reference to the drawings of FIGS. 5 to 7. FIG. 5 is a chart illustrating switching states of the inverter 2 used in the first embodiment. FIG. 6 is a vector diagram illustrating a set of first voltage pulse commands that the inverter 2 can output. FIG. 7 is a vector diagram illustrating a set of second voltage pulse commands that the inverter 2 can output.

FIG. 5 lists possible switching patterns in the inverter 2 in one phase when control is provided such that the upper arm switch 6 and the lower arm switch 7 are turned on or off. In FIG. 5, a switching pattern to provide control such that the upper arm switch 6 is turned on and the lower arm switch 7 is turned off is assigned a value "1", while a switching pattern to provide control such that the upper arm switch 6 is turned off and the lower arm switch 7 is turned on is assigned a value "0". These switching patterns are also used in Patent Literature 1 described above.

As used in the first embodiment, a switching pattern to provide control such that the upper arm switch 6 and the lower arm switch 7 are both turned off is now newly assigned a value "X". Generally, to avoid load release, a voltage source inverter does not use a switching pattern to provide control such that the upper arm switch 6 and the lower arm switch 7 are both turned off during driving of an inductive load such as a motor. In contrast, the magnetic pole position detection technique in the first embodiment also involves driving of an inductive load, but uses a switching pattern that periodically turns on and off the motor current, and thus the upper arm switch 6 and the lower arm switch 7 can both be turned off. Note that, due to unavoidability of input short-circuit, the switching pattern to provide control such that the upper arm switch 6 and the lower arm switch 7 are both turned on is not used even in the first embodiment.

FIGS. 6 and 7 illustrate voltage pulse commands each having a non-zero vector magnitude that the inverter 2 can output. As used in relation to FIGS. 6 and 7, each of the voltage pulse commands illustrated in the vector diagrams is referred to as "voltage vector".

In FIG. 6, voltage vectors V1 to V6 can be derived using Equations (1) to (4) given below.

[Formula 1]

$$\begin{bmatrix} V_\alpha \\ V_\beta \end{bmatrix} = \sqrt{\frac{2}{3}} \begin{bmatrix} 1 & -\frac{1}{2} & -\frac{1}{2} \\ 0 & \frac{\sqrt{3}}{2} & -\frac{3}{2} \end{bmatrix} \begin{bmatrix} V_u \\ V_v \\ V_w \end{bmatrix} \quad (1)$$

[Formula 2]

$$|V| = \sqrt{V_\alpha^2 + V_\beta^2} \quad (2)$$

[Formula 3]

$$\theta = \tan^{-1} \frac{V_\beta}{V_\alpha} \quad (3)$$

[Formula 4]

$$V = |V| \angle \theta \quad (4)$$

In Equation (1) above, $V_u$, $V_v$, and $V_w$ are, as also illustrated in FIG. 2, potentials at the connection points between the upper arm switch 6 and the lower arm switch 7 in their respective phase legs. As used herein, the connection point between the upper arm switch 6 and the lower arm switch 7 in each of the phase legs is referred to as "virtual neutral point", and the potential of a virtual neutral point is referred to as "virtual neutral point potential". In Equation (1) above, $V_\alpha$ and $V_\beta$ are values obtained by decomposing the virtual neutral point potentials $V_u$, $V_v$, and $V_w$ into a component along the α-axis and a component along the β-axis orthogonal to the α-axis, in an α-β coordinate system. Once $V_\alpha$ and $V_\beta$ are calculated by Equation (1) above, Equation (2) above provides the magnitude of the voltage vector and Equation (3) above provides the phase angle θ of the voltage vector. Then, Equations (2) and (3) above together provide the voltage vector expressed by Equation (4) as illustrated in FIG. 6.

In FIG. 6, the numbers in parentheses are each a value of the switching pattern illustrated in FIG. 5 and they represent the switching patterns of the U-phase leg 8, of the V-phase leg 9, and of the W-phase leg 10 from left to right. By way of specific example, V1 (1, 0, 0) indicates that the upper arm switch 6 of the U-phase leg 8 is in an ON state, the lower arm switch 7 of the V-phase leg 9 is in an ON state, the lower arm switch 7 of the W-phase leg 10 is in an ON state, and the other ones of the upper arm switches 6 and of the lower arm switches 7 are in an OFF state. Moreover, V6 (1, 0, 1) indicates that the upper arm switch 6 of the U-phase leg 8 is in an ON state, the lower arm switch 7 of the V-phase leg 9 is in an ON state, the upper arm switch 6 of the W-phase leg 10 is in an ON state, and the other ones of the upper arm switches 6 and of the lower arm switches 7 are in an OFF state.

In addition, FIG. 7 illustrates voltage vectors V7 to V12. Voltage vectors V7 to V12 are each a voltage vector in a case of one phase opened, which can be output by the inverter 2 by use of the switching pattern X illustrated in the table of FIG. 5. Similarly to voltage vectors V1 to V6, voltage vectors V7 to V12 for one phase opened can be derived using Equations (1) to (4) above. As is obvious from comparison between the vector diagrams of FIGS. 6 and 7, voltage vectors V1 to V6 and voltage vectors V7 to V12 have a phase difference of 30° therebetween.

In addition, since no current flows in the open phase in regard to voltage vectors V7 to V12, the potential of the open phase is equal to the neutral point potential of the motor 50 and thus has a value obtained by equally dividing the voltage from the voltage source 11 by means of the motor impedances 12. Although the neutral point potential of the motor 50 varies due to the effect of magnetic saturation, the effect is ignored here on the assumption that the effect is small. The voltage vectors that the inverter 2 can output in a case of one phase opened are the six patterns of V7 to V12. Although this number is the same as the number of patterns in a case of three-phase connection, the condition in which one phase is always open reduces the number of times the switches are turned on and off, thereby providing an advantage in that the switching loss is reduced.

Figure 8:
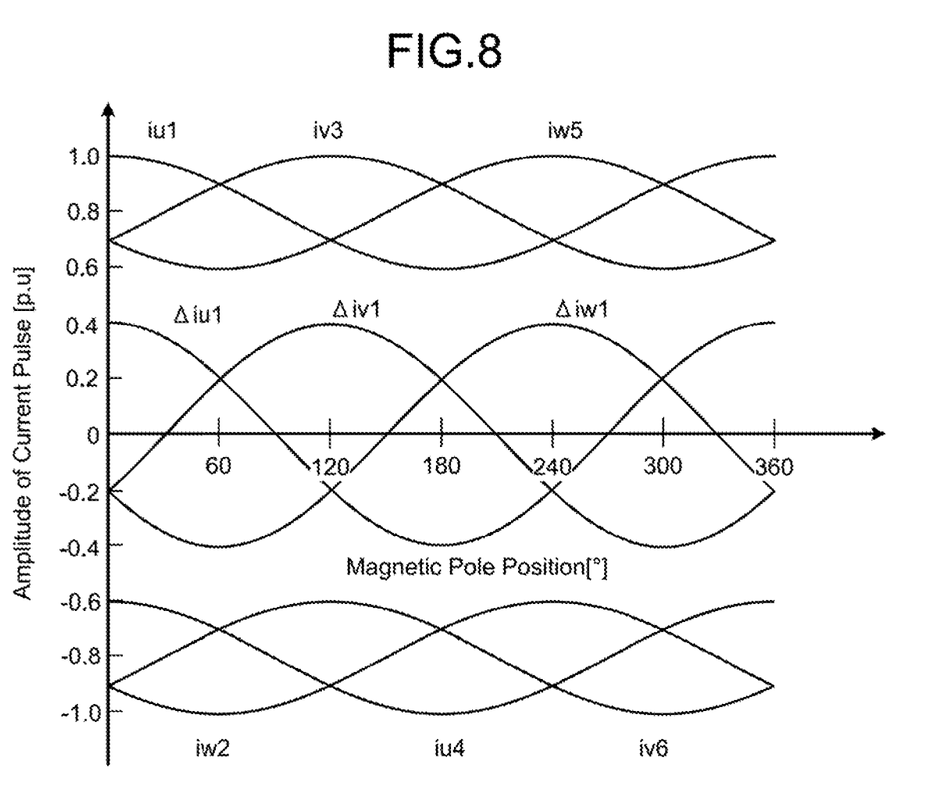
FIG. 8 is a diagram illustrating an example of changes in the motor currents during application of voltage vectors V1 to V6.
Figure 9:
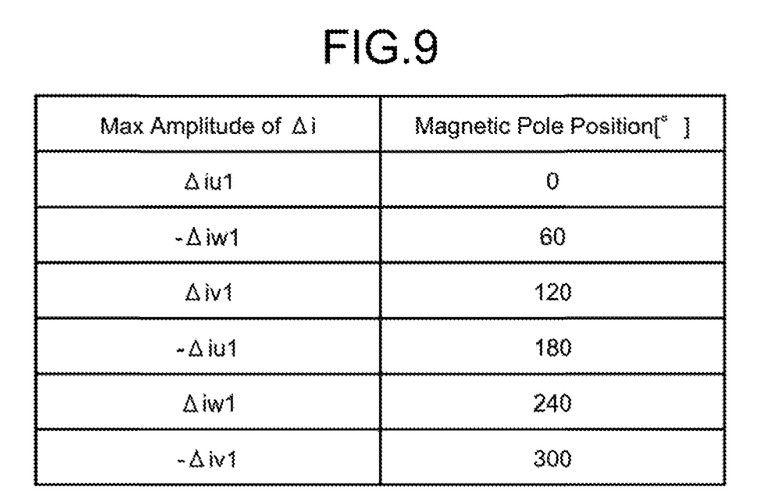
FIG. 9 is a chart illustrating a first estimation table of the magnetic pole position obtained using the relationships of the changes in the motor currents illustrated in FIG. 8.
Figure 10:
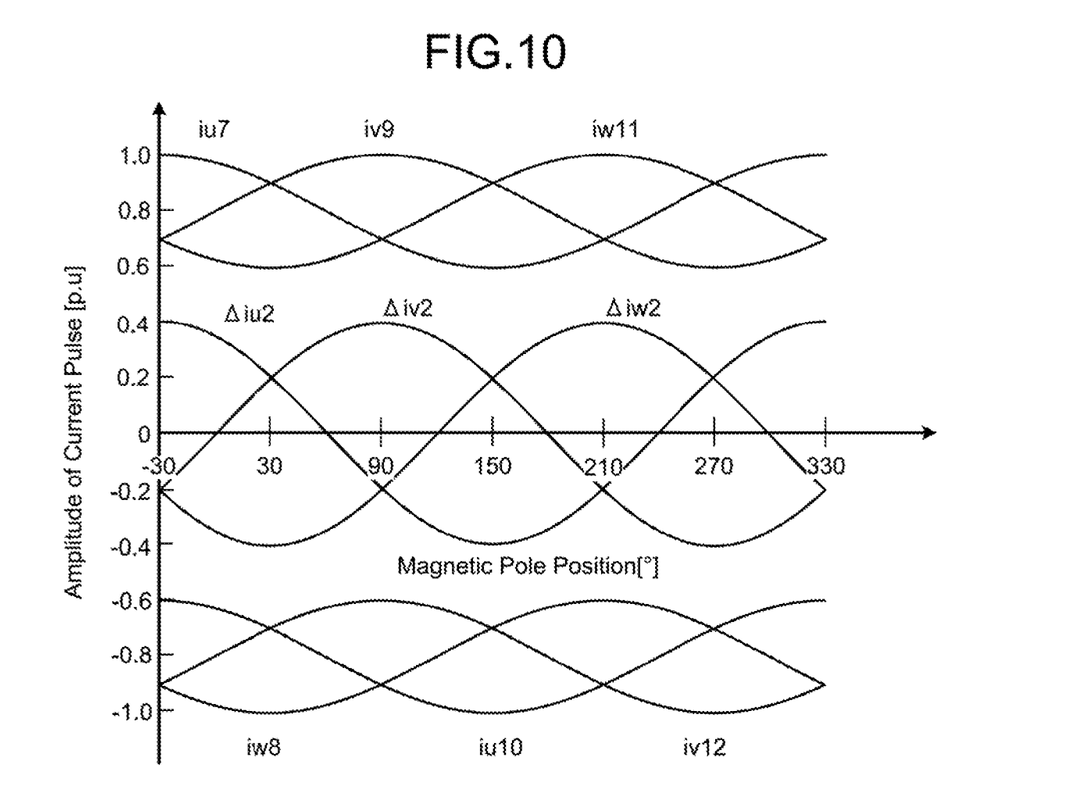
FIG. 10 is a diagram illustrating an example of changes in the motor currents during application of voltage vectors V7 to V12.
Figure 11:
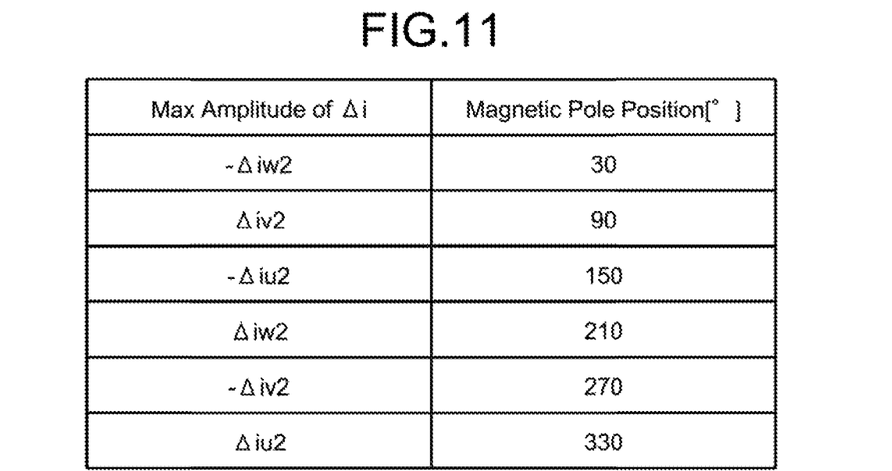
FIG. 11 is a chart illustrating a second estimation table of the magnetic pole position obtained using the relationships of the changes in the motor currents illustrated in FIG. 10.
Figure 12:
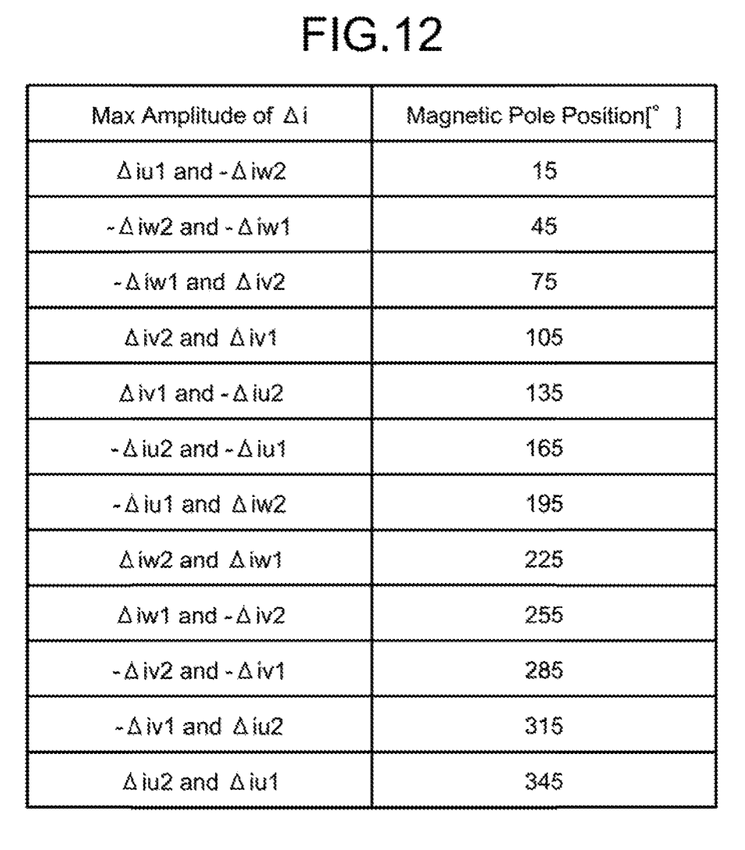
FIG. 12 is a chart illustrating a third estimation table of the magnetic pole position obtained using the relationships of the changes in the motor currents illustrated in both FIGS. 8 and 10.

An algorithm for estimating the magnetic pole position in the first embodiment will next be described with reference to the drawings of FIGS. 8 to 12. FIG. 8 is a diagram illustrating an example of changes in the motor currents during application of voltage vectors V1 to V6. FIG. 9 is a chart illustrating a first estimation table of the magnetic pole position obtained using the relationships of the changes in the motor currents illustrated in FIG. 8. FIG. 10 is a diagram illustrating an example of changes in the motor currents during application of voltage vectors V7 to V12. FIG. 11 is a chart illustrating a second estimation table of the magnetic pole position obtained using the relationships of the changes in the motor currents illustrated in FIG. 10. FIG. 12 is a chart illustrating a third estimation table of the magnetic pole position obtained using the relationships of the changes in the motor currents illustrated in both FIGS. 8 and 10.

The upper and lower portions of FIG. 8 illustrate motor currents iu1, iw2, iv3, iu4, iw5, and iv6 during application of voltage vectors V1 to V6. The motor current iu1 is the motor current iu during application of voltage vector V1. In a similar manner, the motor current iw2 is the motor current iw during application of voltage vector V2, the motor current iv3 is the Motor current iv during application of voltage vector V3, the motor current iu4 is the motor current iu during application of voltage vector V4, the motor current iw5 is the motor current iw during application of voltage vector V5, and the motor current iv6 is the motor current iv during application of voltage vector V6, The direction in which a current flowing from the inverter 2 to the motor 50 is herein defined as positive. Thus, the motor currents iu1, iv3, and iw5 have positive values, and the motor currents iw2, iu4, and iv6 have negative values.

Due to increase or decrease in magnetization in the motor impedances 12, which serve as inductive loads, dependent on the rotor magnet position of the motor 50, application of even a voltage vector having the same magnitude for the same time period may result in a different motor current value depending on the position of the rotor magnet. This means that the magnitude relationship between the current amplitudes during application of a voltage vector enables the magnetic pole position to be estimated. Note that, in this operation, the voltage is applied to the motor 50 for a time period that is long enough to cause magnetic saturation of the motor windings and that allows a current to flow in an amount not to rotate the motor 50.

The middle portion of FIG. 8 illustrates waveforms of $\Delta iu1$, $\Delta iv1$, and $\Delta iw1$. The left column of the first estimation table illustrated in FIG. 9 lists $\Delta iu1$, $\Delta iv1$, and $\Delta iw1$, and $-\Delta iu1$, $-\Delta iv1$, and $-\Delta iw1$, which are $\Delta iu1$, $\Delta iv1$, and $\Delta iw1$ with inverted signs. These values are calculated using Equations (5) to (7) below.

[Formula 5]

$$\Delta iu1 = iu1 + iu4 \quad (5)$$

[Formula 6]

$$\Delta iv1 = iv3 + iv6 \quad (6)$$

[Formula 7]

$$\Delta iw1 = iw2 + iw5 \quad (7)$$

As used herein, the values $\Delta iu1$, $\Delta iv1$, and $\Delta iw1$ calculated using Equations (5) to (7) above are each referred to as "phase current amplitude sum". The calculation unit 4 calculates the phase current amplitude sums $\Delta iu1$, $\Delta iv1$, and $\Delta iw1$ using the motor currents iu1, iw2, iv3, iu4, iw5, and iv6, and then estimates the motor magnetic pole position using the first estimation table illustrated in FIG. 9. By way of specific example, the calculation unit 4 selects the maximum value from a set of six phase current amplitude sums $\{\Delta iu1, \Delta iv1, \Delta iw1, -\Delta iu1, -\Delta iv1, -\Delta iw1\}$ consisting of $\Delta iu1$, $\Delta iv1$, and $\Delta iw1$, and $-\Delta iu1$, $-\Delta iv1$, and $-\Delta iw1$, which are $\Delta iu1$, $\Delta iv1$, and $\Delta iw1$ with inverted signs. Then, if $\Delta iu1$ is the maximum value, the motor magnetic pole position is estimated to be 0°, while if $-\Delta iu1$ is the maximum value, the motor magnetic pole position is estimated to be 180°. A maximum value other than $\pm\Delta iu1$ also allows the motor magnetic pole position to be estimated using the first estimation table illustrated in FIG. 9.

Note that when the magnetic pole position is estimated using six voltage vectors output by the inverter 2 as described above, because 360° divided by six is 60°, there is an estimation error of ±30° in the estimated magnetic pole position value. By way of specific example, if $\Delta iu1$ is the maximum value among the set of six phase current amplitude sums $\{\Delta iu1, \Delta iv1, \Delta iw1, -\Delta iu1, -\Delta iv1, -\Delta iw1\}$, the magnetic pole position is estimated to be 0°, which means that the actual magnetic pole position is within a range from −30° to 30°.

The upper and lower portions of FIG. 10 illustrate motor currents iu7, iw8, iv9, iu10, iw11, and iv12 during application of voltage vectors V7 to V12. The motor current iu7 is the motor current iu during application of voltage vector V7. In a similar manner, the motor current iw8 is the motor current iw during application of voltage vector V8, the motor current iv9 is the motor current iv during application of voltage vector V9, the motor current iu10 is the motor current iu during application of voltage vector V10, the motor current iw11 is the motor current iw during application of voltage vector V11, and the motor current iv12 is the motor current iv during application of voltage vector V12. The direction in which a current flowing from the inverter 2 to the motor 50 is herein defined as positive. Thus, the motor currents iu7, iv9, and iw11 have positive values, and the motor currents iw8, iu10, and iv12 have negative values.

The middle portion of FIG. 10 illustrates waveforms of $\Delta iu2$, $\Delta iv2$, and $\Delta iw2$. The left column of the second estimation table illustrated in FIG. 11 lists $\Delta iu2$, $\Delta iv2$, and $\Delta iw2$, and $-\Delta iu2$, $-\Delta iv2$, and $-\Delta iw2$, which are $\Delta iu2$, $\Delta iv2$, and $\Delta iw2$ with inverted signs. These values are calculated using Equations (8) to (10) below.

[Formula 8]

$$\Delta iu2 = iu7 + iu10 \quad (8)$$

[Formula 9]

$$\Delta iv2 = iv9 + iv12 \quad (9)$$

[Formula 10]

$$\Delta iw2 = iw8 + iw11 \quad (10)$$

The calculation unit 4 calculates the phase current amplitude sums $\Delta iu2$, $\Delta iv2$, and $\Delta iw2$ using the motor currents iu7, iw8, iv9, iu10, iw11, and iv12 according to Equations (8) to (10) above, and then estimates the motor magnetic pole position using the second estimation table illustrated in FIG. 11. By way of specific example, the calculation unit 4 selects the maximum value from a set of six phase current amplitude sums (Δiu2, Δiv2, Δiw2, −Δiu2, −Δiv2, −Δiw2) consisting of Δiu2, Δiv2, and Δiw2, and −Δiu2, −Δiv2, and −Δiw2, which are Δiu2, Δiv2, and Δiw2 with inverted signs. Then, if −Δiw2 is the maximum value, the motor magnetic pole position is estimated to be 30°, while if Δiw2 is the maximum value, the motor magnetic pole position is estimated to be 210°. A maximum value other than ±Δiw2 also allows the motor magnetic pole position to be estimated using the second estimation table illustrated in FIG. 11.

Note that, also in a case of use of the second estimation table, the magnetic pole position is estimated using six voltage vectors; therefore, there is an estimation error of ±30° in the magnetic pole position value. In contrast, use of both the first estimation table illustrated in FIG. 9 and the second estimation table illustrated in FIG. 11 in combination enables the magnetic pole position to be estimated with an accuracy of ±15°. FIG. 12 illustrates estimation of the magnetic pole position with an accuracy of ±15°. By way of specific example, the expression "Δiu1 and −Δiw2" in the left column of FIG. 12 indicates a case where "Δiu1" is determined as the maximum value in the first estimation table illustrated in FIG. 9 and "−Δiw2" is determined as the maximum value in the second estimation table illustrated in FIG. 11. Thus, "Δiu1 and −Δiw2" leads to a determination that the magnetic pole position is in a range from 0° to 30°, and it is thus estimated that the actual magnetic pole position is in a range within ±15° about the angle of 15°. That is, use of the third estimation table illustrated in FIG. 12 enables the magnetic pole position to be estimated with an accuracy of ±15°.

A comparison of values may further be made between the phase current amplitude sums in the case of application of the set of first voltage pulse commands illustrated in FIG. 6 and in the case of application of the set of second voltage pulse commands illustrated in FIG. 7 to determine to which estimation value the magnetic pole position is nearer. By way of specific example, if it is determined, with reference to the third estimation table, that the maximum value combination is "Δiu1 and −Δiw2", the values "Δiu1" and "−Δiw2" are further compared with each other, and if "Δiu1" is greater, it is possible to determine that the magnetic pole position is nearer to 0°, while if "−Δiw2" is greater, it is possible to determine that the magnetic pole position is nearer to 30°. That is, if "Δiu1" is greater, it is possible to estimate that the magnetic pole position is in a range from 0° to 15°, and if "−Δiw2" is greater, it is possible to estimate that the magnetic pole position is in a range from 15° to 30°. In either case, the magnetic pole position can be estimated with an accuracy of ±7.5°. Note that the first voltage pulse commands illustrated in FIG. 6 and the second voltage pulse commands illustrated in FIG. 7 have different voltage vector amplitudes. Thus, the comparison of the phase current amplitude sums can be made after multiplying the obtained current value by an adjustment factor so that it is possible to assume that voltage vectors having the same magnitude are applied.

Figure 13:
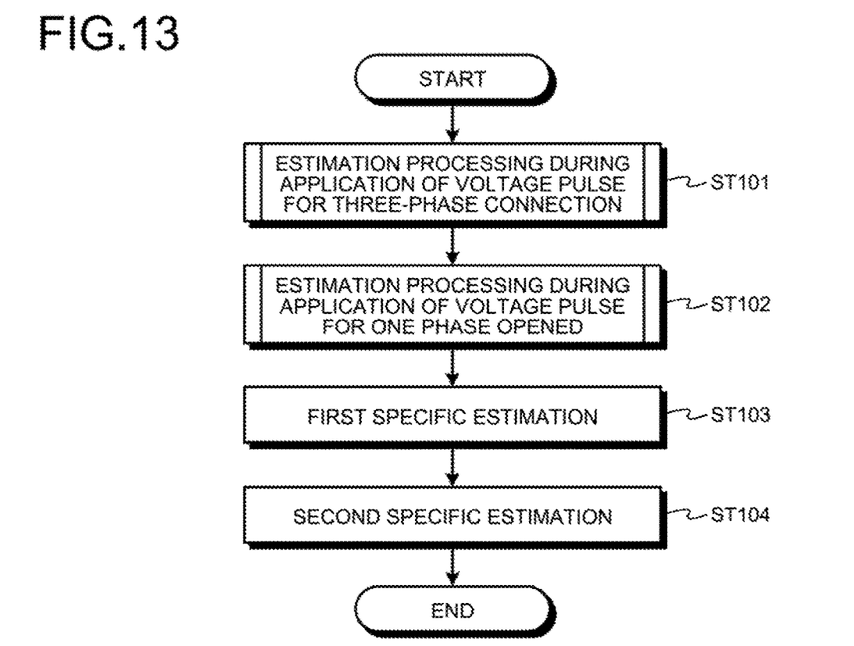
FIG. 13 is a flowchart illustrating a main flow of magnetic pole position estimation processing in the first embodiment.
Figure 14:
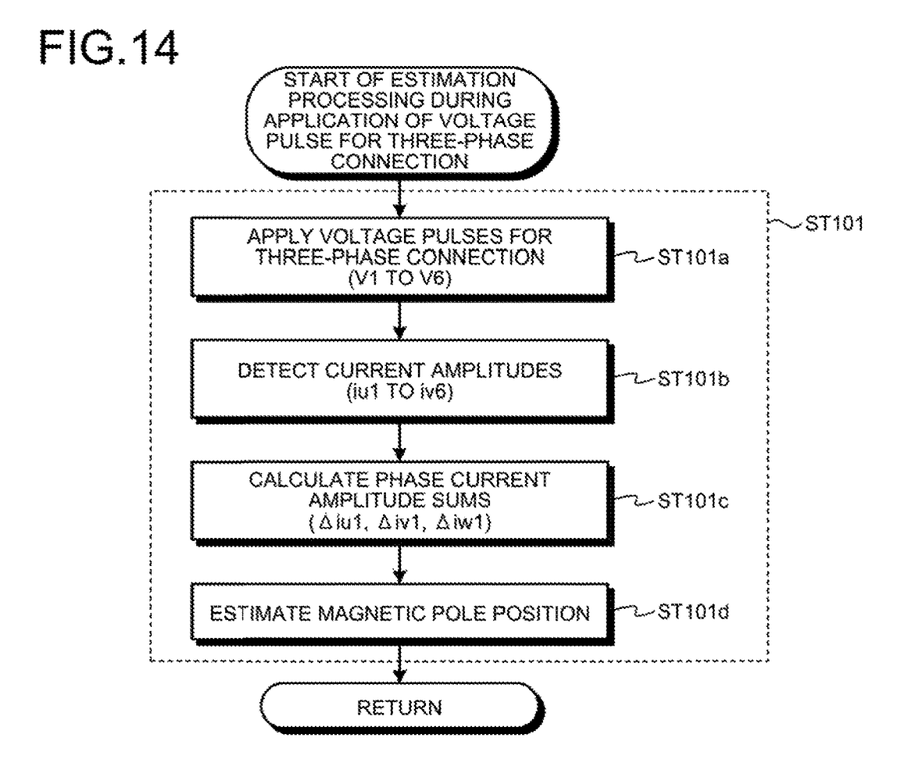
FIG. 14 is a flowchart illustrating "estimation processing during application of a voltage pulse for three-phase connection" in the main flow illustrated in FIG. 13.
Figure 15:
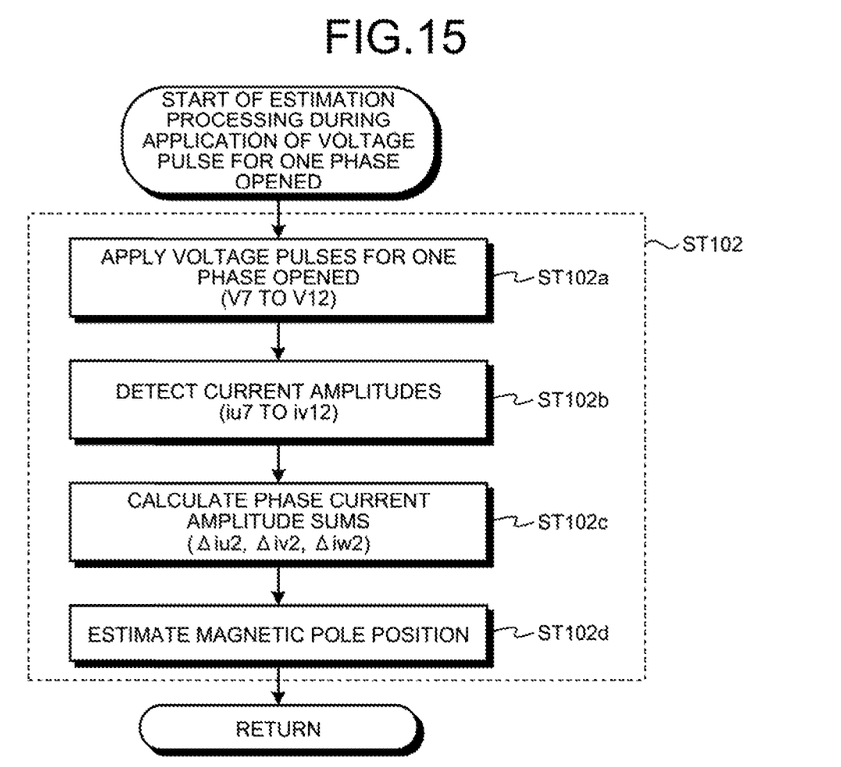
FIG. 15 is a flowchart illustrating "estimation processing during application of a voltage pulse for one phase opened" in the main flow illustrated in FIG. 13.

An overall flow of estimating the magnetic pole position will next be described with reference to the drawings of FIGS. 13 to 15 in a case when the algorithm for estimating the magnetic pole position according to the first embodiment described above is used. FIG. 13 is a flowchart illustrating a main flow of magnetic pole position estimation processing in the first embodiment. FIG. 14 is a flowchart illustrating "estimation processing during application of voltage pulse for three-phase connection" in the main flow illustrated in FIG. 13. FIG. 15 is a flowchart illustrating "estimation processing during application of voltage pulse for one phase opened" in the main flow illustrated in FIG. 13.

In FIG. 13, at step ST101, estimation processing during application of a voltage pulse for three-phase connection is performed. This step is specifically illustrated in the flowchart of FIG. 14. FIG. 14 illustrates that, at step ST101a, the calculation unit 4 causes voltage pulses V1 to V6 for three-phase connection described above to be applied; at step ST101b, the current detection unit 3 detects the amplitude values of the motor currents iu1 to iv6; at step ST101c, the calculation unit 4 calculates the phase current amplitude sums Δiu1, Δiv1, and Δiw1 described above; and at step ST101d, the calculation unit 4 estimates the magnetic pole position. The estimated value of the magnetic pole position determined at this step has an accuracy of ±30°. After completion of processing at step ST101d, the process proceeds to step ST102 of FIG. 13.

At step ST102, estimation processing during application of a voltage pulse for one phase opened is performed. This step is specifically illustrated in the flowchart of FIG. 15. FIG. 15 illustrates that, at step ST102a, the calculation unit 4 causes voltage pulses V7 to V12 for one phase opened described above to be applied; at step ST102b, the current detection unit 3 detects the amplitude values of the motor currents iu7 to iv12; at step ST102c, the calculation unit 4 calculates the phase current amplitude sums Δiu2, Δiv2, and Δiw2 described above; and at step ST102d, the calculation unit 4 estimates the magnetic pole position. The estimated value of the magnetic pole position determined at this step has an accuracy of ±30°. After completion of processing at step ST102d, the process proceeds to step ST103 of FIG. 13.

FIG. 13 describes the processing at step ST103 as "first specific estimation". As used herein, the estimated value of the magnetic pole position determined at step ST101 is referred to as "first magnetic pole position estimated value", and the estimated value of the magnetic pole position determined at step ST102 is referred to as "second magnetic pole position estimated value". In the first specific estimation processing, the average value of the first magnetic pole position estimated value and the second magnetic pole position estimated value is calculated as a new estimated value. The estimated value of the magnetic pole position determined in this process has an accuracy of ±15°. After completion of processing at step ST103, the process proceeds to step ST104.

FIG. 13 describes the processing at step ST104 as "second specific estimation". As used herein, the current amplitude detected during application of the voltage vector used in determination of the first magnetic pole position estimated value is referred to as "first current amplitude", while the current amplitude detected during application of the voltage vector used in determination of the second magnetic pole position estimated value is referred to as "second current amplitude". In addition, the estimated value determined in the first specific estimation processing is referred to as "third magnetic pole position estimated value". In the second specific estimation processing, the first current amplitude is compared with the second current amplitude. If the first current amplitude is greater than the second current amplitude, the average value of the first magnetic pole position estimated value and the third magnetic pole position estimated value is calculated as a new estimated value. Otherwise, if the second current amplitude is greater than the first current amplitude, the average value of the second magnetic pole position estimated value and the third magnetic pole position estimated value is calculated as a new estimated value. The estimated value of the magnetic pole position determined in this process has an accuracy of ±7.5°.

Note that the processing at step ST104 described above, i.e., the second specific estimation processing, is performed such that the first current amplitude is compared with the second current amplitude, and if the first current amplitude is greater than the second current amplitude, the average value of the first magnetic pole position estimated value and the third magnetic pole position estimated value is calculated as a new estimated value. However, the new estimated value calculated at step ST104 is not limited to such average value. If the difference between the first current amplitude and the second current amplitude is relatively small, then a value nearer to the third magnetic pole position estimated value than the average value of the first magnetic pole position estimated value and the third magnetic pole position estimated value may instead be used as the estimated value of the magnetic pole position. In a similar manner, the second specific estimation processing described above is performed such that the first current amplitude is compared with the second current amplitude, and if the second current amplitude is greater than the first current amplitude, the average value of the second magnetic pole position estimated value and the third magnetic pole position estimated value is calculated as a new estimated value. However, the new estimated value is not limited to such average value. If the difference between the second current amplitude and the first current amplitude is relatively small, then a value nearer to the third magnetic pole position estimated value than the average value of the second magnetic pole position estimated value and the third magnetic pole position estimated value may instead be used as the estimated value of the magnetic pole position.

As described above, according to the magnetic pole position detection device and the motor control device according to the first embodiment, the estimation range is narrowed down on the basis of the position common to the first magnetic pole position estimated value, which is estimated on the basis of the motor current that flows during application of the voltage pulse command for three-phase connection, and the second magnetic pole position estimated value, which is estimated on the basis of the motor current that flows during application of the voltage pulse command for one phase opened. This enables the magnetic pole position to be estimated with a higher accuracy than a conventional technique does.

Moreover, according to the magnetic pole position detection device and the motor control device according to the first embodiment, a third magnetic pole position estimated value is generated by narrowing down the estimation range on the basis of the position common to the first magnetic pole position estimated value and the second magnetic pole position estimated value, and in addition, a magnitude comparison is made between the first current amplitude, detected during application of the voltage vector used in determination of the first magnetic pole position estimated value, and the second current amplitude, detected during application of the voltage vector used in determination of the second magnetic pole position estimated value, and if the first current amplitude is greater than the second current amplitude, the estimation range is further narrowed down on the basis of the first magnetic pole position estimated value and the third magnetic pole position estimated value, while, if the second current amplitude is greater than the first current amplitude, the estimation range is further narrowed down on the basis of the second magnetic pole position estimated value and the third magnetic pole position estimated value. This enables the magnetic pole position to be estimated with an even higher accuracy.

Second Embodiment

Figure 16:
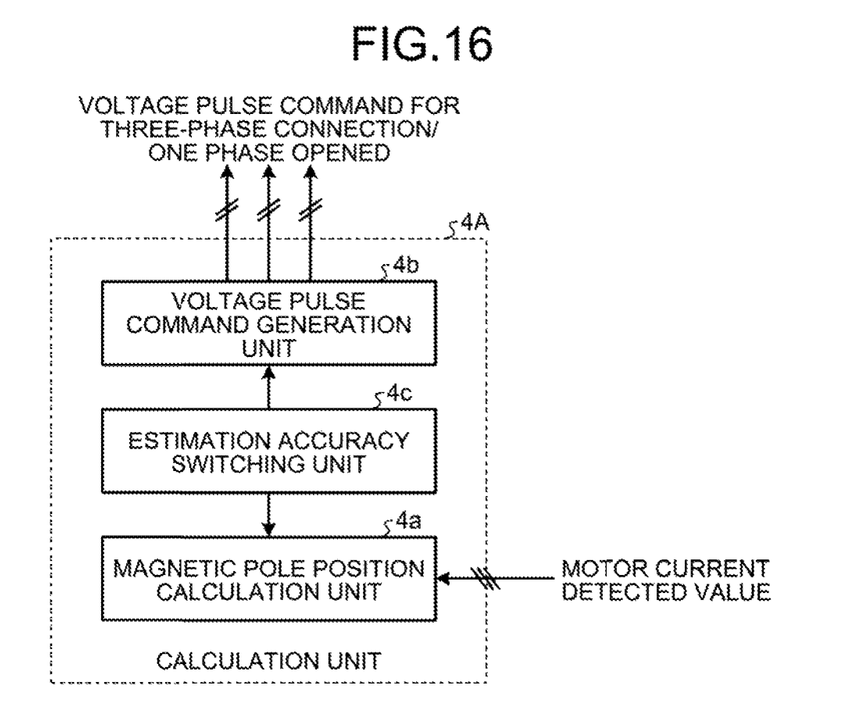
FIG. 16 is a block diagram illustrating a specific configuration of a calculation unit in a second embodiment.

FIG. 16 is a block diagram illustrating a specific configuration of a calculation unit 4A in a second embodiment. The calculation unit 4A in the second embodiment further includes an estimation accuracy switching unit 4*c* for switching accuracy of estimation of the magnetic pole position in addition to the components of the calculation unit 4 in the first embodiment illustrated in FIG. 3. The other portion of the configuration is identical or equivalent to the configuration of the first embodiment illustrated in FIG. 3. Identical or equivalent elements are designated by like reference characters, and duplicate description will be omitted.

Figure 17:
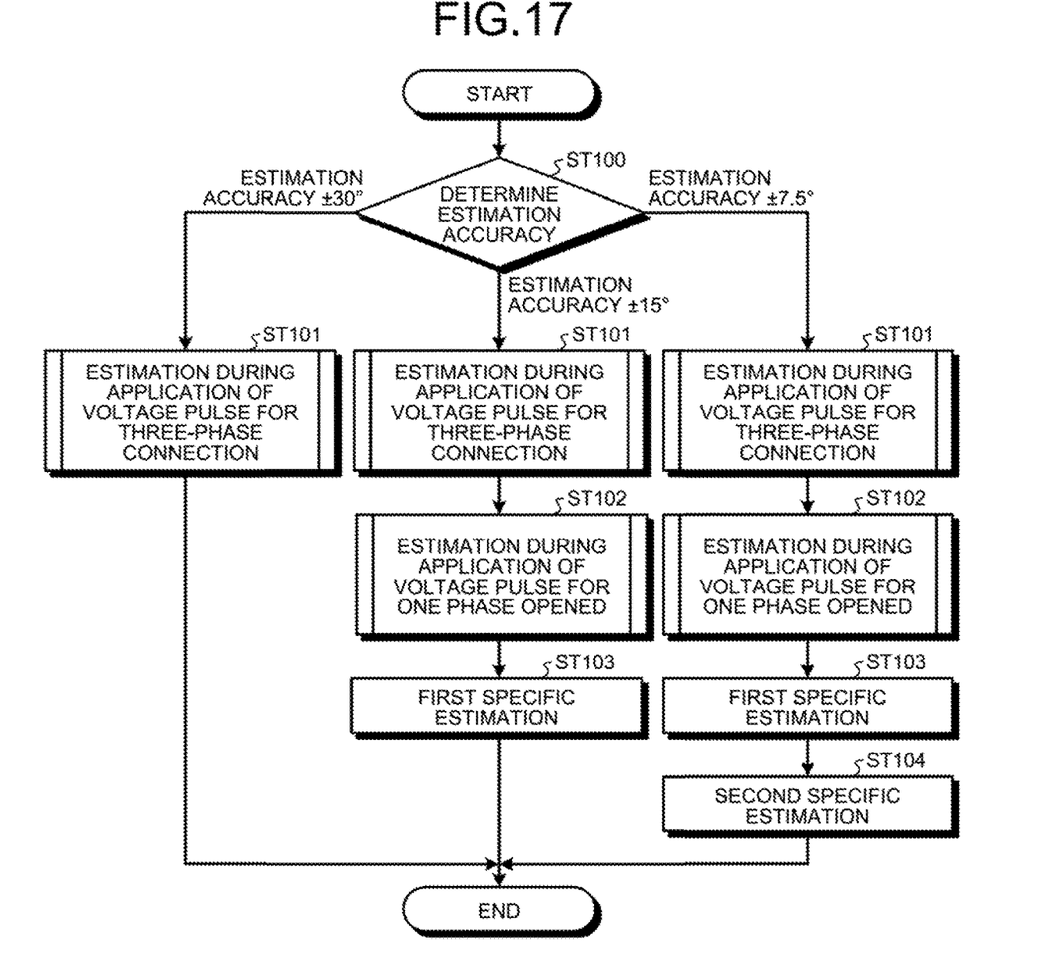
FIG. 17 is a flowchart illustrating a main flow in the second embodiment, with the main flow here including an estimation accuracy switching feature.

FIG. 17 is a flowchart illustrating a main flow in the second embodiment, with the main flow here including an estimation accuracy switching function. First, at step ST100, the estimation accuracy switching unit 4*c* determines estimation accuracy, and then information concerning the estimation accuracy determined is transmitted to the magnetic pole position calculation unit 4*a*, and the estimation accuracy is transmitted to the voltage pulse command generation unit 4*b*. The estimation accuracy may be determined as desired by the estimation accuracy switching unit 4*c*.

If it is determined that the estimation accuracy is ±30°, which is a first estimation accuracy, only the processing of step ST101 illustrated in FIG. 14 is performed, after which the process is terminated.

If it is determined that the estimation accuracy is ±15°, which is a second estimation accuracy, the processing of step ST101 illustrated in FIG. 14 and the processing of step ST102 illustrated in FIG. 15 are performed. Then, at next step ST103, the first specific estimation processing described in relation to the first embodiment is performed, after which the process is terminated.

If it is determined that the estimation accuracy is ±7.5°, which is a third estimation accuracy, the processing of step ST101 illustrated in FIG. 14 and the processing of step ST102 illustrated in FIG. 15 are performed. Then, at next step ST103, the first specific estimation processing described in relation to the first embodiment is performed, and then at step ST104, the second specific estimation processing described in relation to the first embodiment is performed, after which the process is terminated.

An estimation accuracy of ±7.5° provides a higher estimation accuracy, but requires a longer processing time, while an estimation accuracy of ±30° enables the magnetic pole position to be estimated only by the processing of step ST101, thereby reducing the processing time. Thus, the processing can be switched on the basis of whether priority is given to the estimation time or to the estimation accuracy.

As described above, according to the magnetic pole position detection device and the motor control device according to the second embodiment, a trade-off can be made between the required estimation time and the required estimation accuracy, thereby providing an advantage in that user demand can be precisely and appropriately met.

The configurations described in the foregoing embodiments are merely examples of various aspects of the present invention. These configurations may be combined with a known other technology, and moreover, a part of such configurations may be omitted and/or modified without departing from the spirit of the present invention.

REFERENCE SIGNS LIST 2 inverter; 3 current detection unit; 4, 4A calculation unit; 4a magnetic pole position calculation unit; 4b voltage pulse command generation unit; 4c estimation accuracy switching unit; 6 upper arm switch; 7 lower arm switch; 8 U-phase leg; 9 V-phase leg; 10 W-phase leg; 11 voltage source; 12 motor impedance; 15 input circuit; 16 CPU; 17 memory; 18 output circuit; 20 magnetic pole position detection device; 30 motor control device; 50 motor.

The invention claimed is:

1. A magnetic pole position detection device that detects a magnetic pole position of a synchronous magnet motor, the detection device comprising:
   a current detector to detect a motor current flowing to each phase of the synchronous magnet motor; and
   a calculator to generate a voltage pulse command to estimate the magnetic pole position; to output the voltage pulse command to an inverter that drives the synchronous magnet motor; and to estimate the magnetic pole position on a basis of the motor current that flows in response to the voltage pulse command during an operation of the inverter, wherein
   the calculator
   generates a first voltage pulse command to actuate all of three leas included in the inverter, and a second voltage pulse command to actuate only two of the three legs, and
   narrows down an estimation range on a basis of a first magnetic pole position estimated value and a second magnetic pole position estimated value, the first magnetic pole position estimated value being estimated on a basis of the motor current that flows during application of the first voltage pulse command, the second magnetic pole position estimated value being estimated on a basis of the motor current that flows during application of the second voltage pulse command.

2. The magnetic pole position detection device according to claim 1, wherein
   the calculator generates, as a third magnetic pole position estimated value, a magnetic pole position that is narrowed down on a basis of a position common to the first magnetic pole position estimated value and the second magnetic pole position estimated value,
   compares a magnitude between a first current amplitude and, a second current amplitude, the first current amplitude being detected during application of the voltage pulse command used in determination of the first magnetic pole position estimated value, the second current amplitude being detected during application of the voltage pulse command used in determination of the second magnetic pole position estimated value,
   narrows down the estimation range on a basis of the first magnetic pole position estimated value and the third magnetic pole position estimated value in a case in which the first current amplitude is greater than the second current amplitude, and
   narrows down the estimation range on a basis of the second magnetic pole position estimated value and the third magnetic pole, position estimated value in a case in which the second current amplitude is greater than the first current amplitude.

3. The magnetic pole position detection device according to claim 2, wherein the calculator includes an estimation accuracy switch to switch processing on a basis of whether priority is given to an estimation time or to an estimation accuracy.

4. The magnetic pole position detection device according to claim 3, wherein the calculator
   generates the first magnetic pole position estimated value in a case when the estimation accuracy is switched to a first estimation accuracy,
   narrows down the estimation range on a basis of the first magnetic pole position estimated value and the second magnetic pole position estimated value in a case when the estimation accuracy is switched to a second estimation accuracy that is a higher accuracy than the first estimation accuracy, and
   narrows down the estimation range on a basis of either the first magnetic pole position estimated value or the second magnetic pole position estimated value as well as on a basis of the third magnetic pole position estimated value in a case when the estimation accuracy is switched to a third estimation accuracy that is a higher accuracy than the second estimation accuracy.

5. A motor control device comprising:
   the magnetic pole position detection device according to claim 4.

6. A motor control device comprising:
   the magnetic pole position detection device according to claim 1.

7. A motor control device comprising:
   the magnetic pole position detection device according to claim 2.

8. A motor control device comprising:
   the magnetic pole position detection device according to claim 3.

* * * * *